US011058032B2

(12) United States Patent
Gaskill

(10) Patent No.: US 11,058,032 B2
(45) Date of Patent: Jul. 6, 2021

(54) MEMORY MODULE COOLER WITH VAPOR CHAMBER DEVICE CONNECTED TO HEAT PIPES

(71) Applicant: HEWLETT PACKARD ENTERPRISE DEVELOPMENT LP, Houston, TX (US)

(72) Inventor: Travis J. Gaskill, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 106 days.

(21) Appl. No.: 16/580,538

(22) Filed: Sep. 24, 2019

(65) Prior Publication Data

US 2020/0022282 A1 Jan. 16, 2020

Related U.S. Application Data

(62) Division of application No. 15/800,695, filed on Nov. 1, 2017, now Pat. No. 10,462,932.

(51) Int. Cl.
| | |
|---|---|
| *H05K 7/20* | (2006.01) |
| *H01L 23/427* | (2006.01) |
| *F28D 15/02* | (2006.01) |
| *B23P 15/26* | (2006.01) |

(52) U.S. Cl.
CPC .......... *H05K 7/20336* (2013.01); *B23P 15/26* (2013.01); *F28D 15/0275* (2013.01); *H01L 23/427* (2013.01); *B23P 2700/09* (2013.01); *Y10T 29/49353* (2015.01)

(58) Field of Classification Search
CPC . B23P 15/26; B23P 2700/09; Y10T 29/49353
See application file for complete search history.

(56) References Cited

U.S. PATENT DOCUMENTS

| | | | | |
|---|---|---|---|---|
| 3,753,364 | A * | 8/1973 | Runyan | F28D 15/04 72/71 |
| 5,216,580 | A * | 6/1993 | Davidson | F28D 15/0266 361/700 |
| 5,253,702 | A * | 10/1993 | Davidson | F28D 15/0233 165/80.4 |
| 6,216,343 | B1 * | 4/2001 | Leland | B21C 37/225 29/890.03 |
| 6,237,223 | B1 * | 5/2001 | McCullough | B23P 15/26 257/E23.089 |

(Continued)

OTHER PUBLICATIONS

HP Development Company, L.P., "HP Z Coolers," Technical White Paper, Aug. 2016, pp. 1-10.

*Primary Examiner* — Jason L Vaughan
(74) *Attorney, Agent, or Firm* — Hewlett Packard Enterprise

(57) ABSTRACT

An example memory cooler may include a vapor chamber device and a number of heat pipes connected to the vapor chamber device. The vapor chamber device may include walls that bound a vapor chamber, the heat pipes may include vapor channels, and the heat pipes may be connected to a first wall of the vapor chamber device such that their respective vapor channels are communicably connected to the vapor chamber. The example memory cooler may also include fins extending from a second wall of the vapor chamber device, the second wall bounding the vapor chamber. The fins and the second wall may be part of the same continuous body.

8 Claims, 8 Drawing Sheets

(56) References Cited

U.S. PATENT DOCUMENTS

| | | | |
|---|---|---|---|
| 6,490,160 B2 * | 12/2002 | Dibene, II | G06F 1/18 165/104.26 |
| 6,647,625 B2 * | 11/2003 | Wang | F28D 15/0275 29/890.032 |
| 6,843,307 B2 * | 1/2005 | Yuyama | F28D 15/0233 165/104.21 |
| 7,061,760 B2 | 6/2006 | Hornung et al. | |
| 7,855,888 B2 | 12/2010 | Peterson | |
| 7,965,511 B2 * | 6/2011 | Refai-Ahmed | H01L 23/427 361/700 |
| 8,570,744 B2 | 10/2013 | Rau et al. | |
| 8,587,943 B2 | 11/2013 | Barina et al. | |
| 8,638,559 B2 | 1/2014 | Barina et al. | |
| 8,659,897 B2 | 2/2014 | Meijer et al. | |
| 8,787,021 B2 | 7/2014 | Murakami et al. | |
| 9,158,348 B2 | 10/2015 | Berk et al. | |
| 9,245,820 B2 | 1/2016 | Goldrian et al. | |
| 9,436,235 B2 * | 9/2016 | Damaraju | H01L 23/427 |
| 10,012,445 B2 | 7/2018 | Lin | |
| 10,048,015 B1 | 8/2018 | Lin | |
| 10,077,946 B2 | 9/2018 | Sun et al. | |
| 10,119,766 B2 * | 11/2018 | Lin | F28D 15/0266 |
| 10,462,932 B2 * | 10/2019 | Gaskill | H01L 23/427 |
| 10,663,231 B2 * | 5/2020 | Tan | F28D 15/0275 |
| 2006/0250772 A1 | 11/2006 | Salmonson et al. | |
| 2007/0272399 A1 * | 11/2007 | Nitta | F28D 15/046 165/185 |
| 2010/0108297 A1 * | 5/2010 | Chen | H01L 23/427 165/104.26 |
| 2011/0008198 A1 * | 1/2011 | Hou | B22F 3/225 419/6 |
| 2014/0369005 A1 * | 12/2014 | Gavillet | C23C 16/26 361/699 |
| 2015/0285562 A1 * | 10/2015 | Huang | B23P 15/26 165/104.21 |
| 2016/0101490 A1 * | 4/2016 | Weasner | F28D 15/0275 29/890.032 |
| 2017/0191709 A1 | 7/2017 | Chen et al. | |
| 2017/0312871 A1 | 11/2017 | Lin | |
| 2017/0314873 A1 * | 11/2017 | Lin | F28D 15/0233 |
| 2018/0292145 A1 | 10/2018 | Sun et al. | |

* cited by examiner

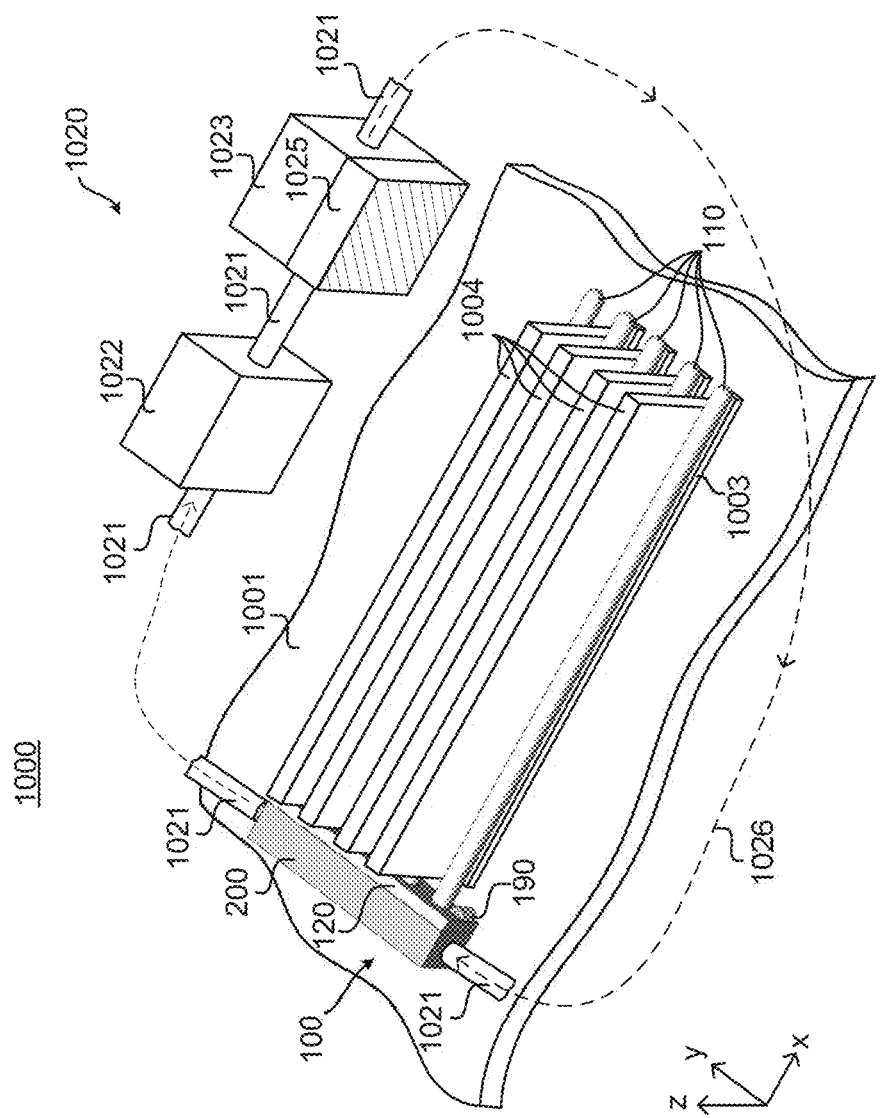

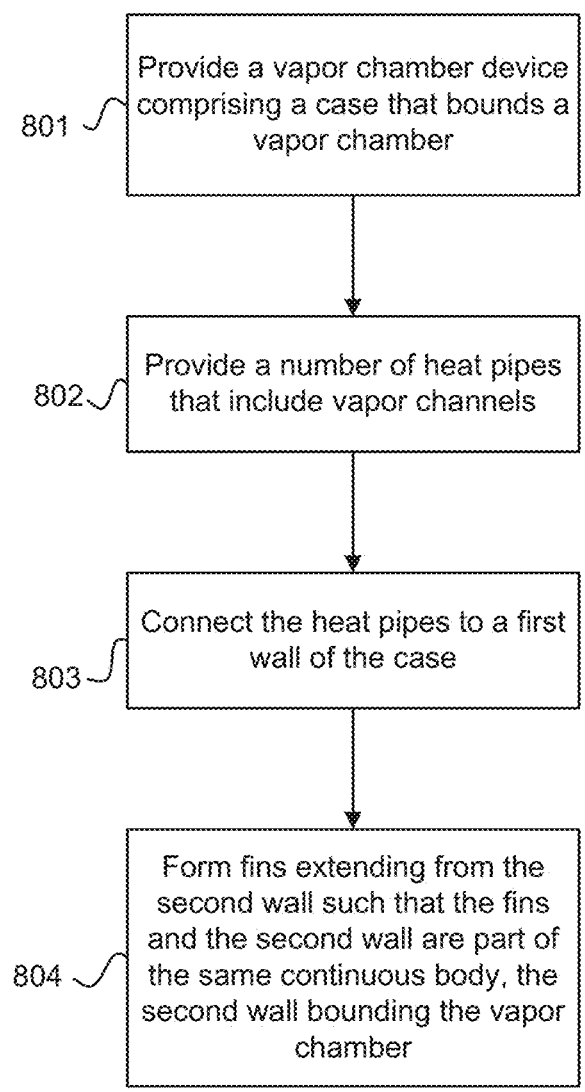

MEMORY MODULE COOLER WITH VAPOR CHAMBER DEVICE CONNECTED TO HEAT PIPES

RELATED PATENT DATA CROSS-REFERENCE TO RELATED APPLICATION

This application is a divisional of U.S. patent application Ser. No. 15/800,695, which was filed on Nov. 1, 2017 and is hereby incorporated by reference in its entirety for all purposes.

BACKGROUND

Computers may include memory modules. When in use, the memory modules may generate excessive heat, which may adversely affect the memory modules and/or other components of the computer. A memory module cooler may be used to cool the memory modules. For example, in some approaches memory modules are installed in a computer's main printed circuit board ("PCB") (e.g., motherboard), which includes the processor(s) of the computer, and then a memory module cooler is attached to the main PCB and/or the memory modules so as to cool the memory modules.

BRIEF DESCRIPTION OF THE DRAWINGS

FIG. 4 illustrates a perspective view of a computer that includes the first example memory module cooling device.

FIG. 5 is a process flow chart illustrating an example process of manufacturing an example memory module cooling device.

In FIG. 6A, a first piece and a second piece of the vapor chamber device are provided. In FIG. 6B the second piece is worked to form fins therein. In FIG. 6C the first piece and the second piece are joined to form the vapor chamber device.

In FIG. 7A, a first piece and a second piece of the vapor chamber device are provided. In FIG. 7B, the first piece and the second piece are joined to form the vapor chamber device. In FIG. 7C, the second piece is worked to form fins therein.

In FIG. 8A, a pipe is provided. In FIG. 8B, the pipe is compressed to form two flat sides. In FIG. 8C, one of the flat sides of the compressed pipe is worked to form fins therein.

In FIG. 9A, a first piece and a second piece of the vapor chamber device are provided, with the first piece having the fins formed therein. In FIG. 9B, the first piece and the second piece are joined to form the vapor chamber device.

DETAILED DESCRIPTION

Figure 1:
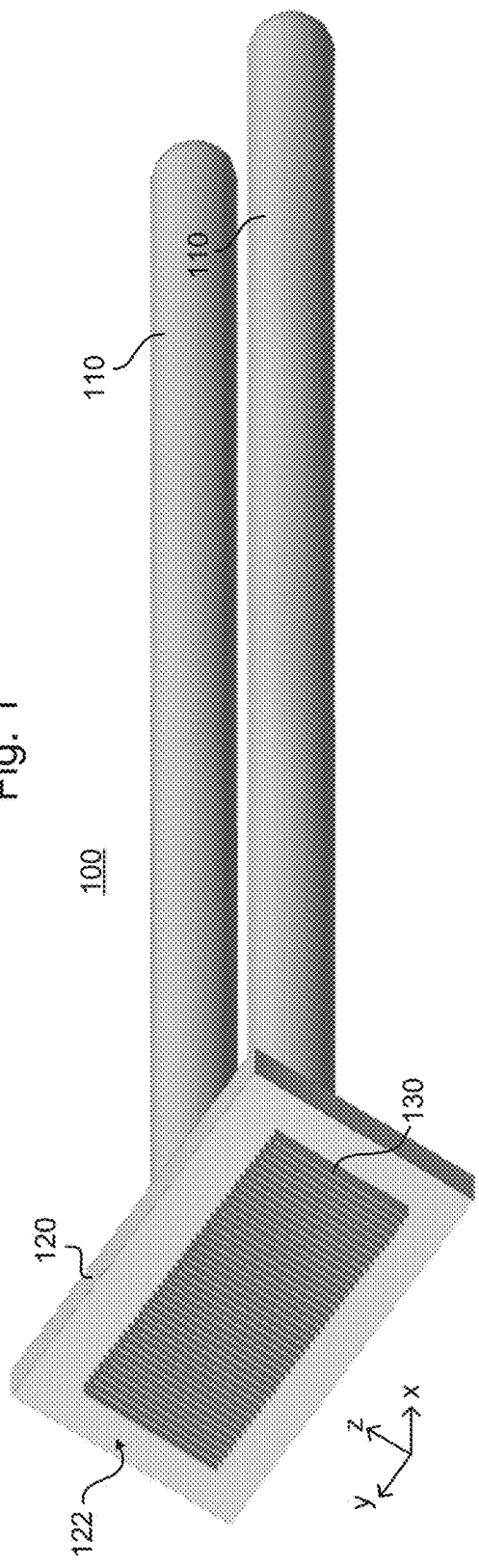
FIG. 1 illustrates a perspective view of a first example memory module cooling device.

Disclosed herein are example memory module cooling devices (also referred to herein as "memory coolers"), computers that include such memory coolers, and methods of manufacturing such memory coolers. The example memory coolers include a vapor chamber device connected to a number of heat pipes, with one wall of the vapor chamber device also serving as a base of a cold plate from which fins extend. The heat pipes are to thermally couple with the memory modules and transfer heat removed from the memory modules into the cold plate.

Heat pipes and vapor chamber devices (also known as planar heat pipes) are heat transfer devices comprising hollow vessels whose interior volume contains a working fluid (e.g., water, methanol, etc.) that is used to transfer heat from a hot side of the device to a cold side of the device via a repeating cycle of vaporization, convection, condensation, and wicking. In particular, the working fluid absorbs heat at the hot side and thus is vaporized, the vapor flows to the cold side via convection, the vapor contacts a wall at the cold side and condenses (thus releasing its heat into the wall), and the liquid flows back to the hot side via a wicking mechanism to start the cycle again. This cycle enables a heat pipe or vapor chamber device to transfer heat at rates that greatly exceed those possible solely from conduction in a solid piece of metal of similar size and shape (even highly conductive metals such as copper).

Vapor chamber devices and heat pipes are distinguished from one another primarily in their shapes. In particular, a heat pipe is generally tubular and elongated, with one relatively large dimension and two relatively small dimensions (e.g., like a plumbing pipe). A heat pipe may be used, for example, to transfer heat from one location to another relatively remote location, with a hot side and a cold side of the heat pipe generally being on opposite ends of its elongated dimension. In contrast, a vapor chamber device is generally planar, with two relatively large dimensions and one relatively small dimension (e.g., like a postal envelope or shallow box). A vapor chamber device may be used, for example, to spread heat from a heat source having a relatively small area into a body having a relatively large area, with a hot side and a cold side of the vapor chamber device generally being on opposite ends of the small dimension. It is possible for a device to have dimensions that appear both heat pipe like and vapor chamber device like, in which case the device may be described as either a heat pipe or a vapor chamber device (or both simultaneously).

In the art, the term "vapor chamber" is sometimes used to refer to the entire heat transfer device as a whole (i.e., both the case/vessel and the volume/chamber enclosed thereby), and other times it is used to refer solely to the enclosed volume. However, to avoid confusion, herein the term "vapor chamber" will be used exclusively as defined below to refer specifically to the enclosed volume (i.e., the chamber) contained within a vapor chamber device, while the device as a whole will be referred to as a "vapor chamber device" as defined below.

As noted above, example memory coolers disclosed herein may include a vapor chamber device connected to a number of heat pipes. In particular, the heat pipes may be coupled to a wall of the vapor chamber device (hereinafter, the "first wall") such that their respective enclosed volumes (i.e., the vapor chamber and vapor channels) are all communicably connected, allowing the working fluid to flow between the vapor chamber of the vapor chamber device and the vapor channels of the heat pipes. Thus, vapor from the heat pipes that is carrying heat removed from the memory modules may directly impinge upon the walls of the vapor chamber device without having to pass through a conductive thermal interface.

In addition, in the example memory coolers disclosed herein, another one of the walls of the vapor chamber device (hereinafter, the "second wall") is also the base of a cold plate. Specifically, the second wall has fins extending outward from it (on the side of the second wall that is not facing into the vapor chamber), and the fins and the second wall (i.e., the base) together form a cold plate. Because the base of the cold plate (i.e., the second wall) is one of the walls of the vapor chamber device, the vapor from the heat pipes may directly impinge upon the base of the cold plate without having to pass through a conductive thermal interface.

Furthermore, the fins may be part of the same continuous body as the second wall. In particular, in some examples the fins are formed by skiving the second wall. Thus, in such examples, the heat transferred from the vapor into the second wall may be conducted from the second wall into the fins without having to pass through any thermal interface.

The example memory coolers may, when installed in a computing device, be used to cool memory modules. In particular, the heat pipes may be thermally coupled with the memory modules, which allows heat generated by the memory modules to be transferred very efficiently to the fins of the memory cooler (via the heat pipes and the vapor chamber device). Specifically, heat from the memory modules may vaporize the working fluid in the heat pipes, the hot vapor may flow via convection into the vapor chamber, the vapor may condense on the second wall releasing heat into the second wall, the heat released into the second wall may transfer via conduction into the fins, and the heat may be transferred from the fins into a heat removal medium such as liquid coolant or air.

In the example memory coolers, the rate at which heat is transferred from the memory modules to the fins of the cold plate is very high.

For example, in example memory coolers disclosed herein the vapor channels of the heat pipes are communicably connected to the vapor chamber, which facilitates superior heat transfer. In particular, in such examples the vapor from the vapor channels of the heat pipes is able to flow directly into the vapor chamber via convection, which allows for heat from the heat pipes to be transferred into the vapor chamber device without having to pass through a conductive thermal interface.

As another example, in example memory coolers described herein, a wall of the vapor chamber (i.e., the second wall) is also the base of the cold plate (i.e., the base of the cold plate and the second wall are one-and-the-same body), which greatly improves heat transfer rates. In particular, the base of the cold plate is directly in contact with the vapor of the vapor chamber, which allows heat to be transferred from the vapor into the base of the cold plate very rapidly and evenly. The direct impingement of the vapor onto the base of the cold plate improves heat transfer in at least two ways. First, in these examples, the vapor may be able to contact essentially the entire area of the base of the cold plate, resulting in heat being transferred from the vapor evenly across the base of the cold plate. Even spreading of heat across the base of the cold plate improves the rate at which heat is transferred from the cold plate into the heat removal medium. Second, in these examples, the only thermal interface separating the heat held in the vapor from the base of the cold plate (i.e., the second wall) is the vapor-condensation interface; specifically, in these examples there is no conductive thermal interface between the second wall of the vapor chamber and the base of the cold plate. By avoiding a conductive interface the rate of heat transfer between the vapor and the cold plate is improved, since each conductive thermal interface that the heat must pass through necessarily decreases the rate of heat transfer.

As another example, in example memory coolers described herein, the fins are part of the same continuous body as the second wall, which even further improves heat transfer rates. In particular, in such examples there is no thermal interface separating the base of the cold plate (i.e., the second wall) from the fins. Thus, heat is able to flow from the base of the cold plate (i.e., the second wall) into the fins at a high rate.

To illustrate how the features described above provide superior heat transfer rates (individually and in combination), various alternative approaches that omit one or more of the features are compared below as contrasting examples to examples described herein.

As a first contrasting example, in a first alternative approach heat pipes may be conductively coupled to the first wall of the vapor chamber without their respective enclosed volumes being communicably connected (e.g., the heat pipes are merely in contact with the vapor chamber). In such an alternative approach, heat from the vapor in the heat pipes must be transferred conductively through a wall of the heat pipe and a wall of the vapor chamber device, passing through at least one conductive thermal interface between the walls along the way. The conduction through the walls reduces the rate of heat transfer as compared to vapor convection across the same distance. In addition, the thermal interface between the walls further reduces the rate of heat transfer, since each thermal interface through which heat must pass reduces the rate of heat transfer (all other things being equal). Thus, example memory coolers described herein whose vapor chambers and vapor channels are communicably connected may transfer heat more rapidly than memory coolers of the first alternative approach.

As a second contrasting example, in a second alternative approach a heat transfer element (such as a heat pipe) may be conductively coupled with the base of the cold plate without the use of any vapor chamber device. In such an example, the heat from the heat transfer element is transferred into the base of the cold plate via a conductive thermal interface, and then is spread through the base of the cold plate via conduction. However, heat can be spread across a wall of a vapor chamber device by vapor condensation much faster and more evenly than heat can be spread across a similarly dimensioned body via conduction alone. Therefore, example memory coolers described herein whose cold plate fins are part of the same continuous body as a wall of a vapor chamber device may transfer heat more rapidly and evenly than memory coolers of the second alternative approach.

As a third contrasting example, in a third alternative approach a vapor chamber device is used between the heat transfer elements and the cold plate, but the base of the cold plate is not also a wall of the vapor chamber device (i.e., they are distinct bodies that are merely thermally coupled to one another). In such an approach, the vapor chamber device may be able to spread the heat evenly before it is transferred into the cold plate, which may be an improvement over the second approach. However, in the third approach the rate of heat transfer may still be lower than in examples described herein. In particular, in the third approach there is a conductive thermal interface between the wall of the vapor chamber device and the base of the cold plate, since they are distinct bodies. As noted above, each thermal interface reduces the rate of heat transfer. Accordingly, examples described herein in which the base of the cold plate is also a wall of the vapor chamber device will transfer heat from the vapor chamber into the cold plate faster than memory coolers that use the third approach.

As a fourth contrasting example, in a fourth alternative approach, the fins of the cold plate are connected to but are not part of the same continuous body as the base of the cold plate. In such an approach, there is at least one thermal interface between the fins and the base of the cold plate, which reduces the rate of heat transfer.

It is noted that benefits resulting from various features were described above individually for ease of description. However, it is noted that, in addition to benefits provided by these features individually, in certain examples the combination of all of these features in an example memory cooler may provide additional benefits. In particular, the combination of the above noted features in a memory cooler may enable heat transfer that is superior to that which would be possible in another memory cooler utilizing one or a subset of the features. Specifically, in some examples, superior heat transfer may be enabled when the memory cooler includes heat pipes to thermally couple with memory modules, a vapor chamber device connected to the heat pipes such that their respective interior volumes are communicably connected, and a wall of the vapor chamber device serving as the base of a cold plate with fins that are part of the same continuous body as the wall.

Figure 2:
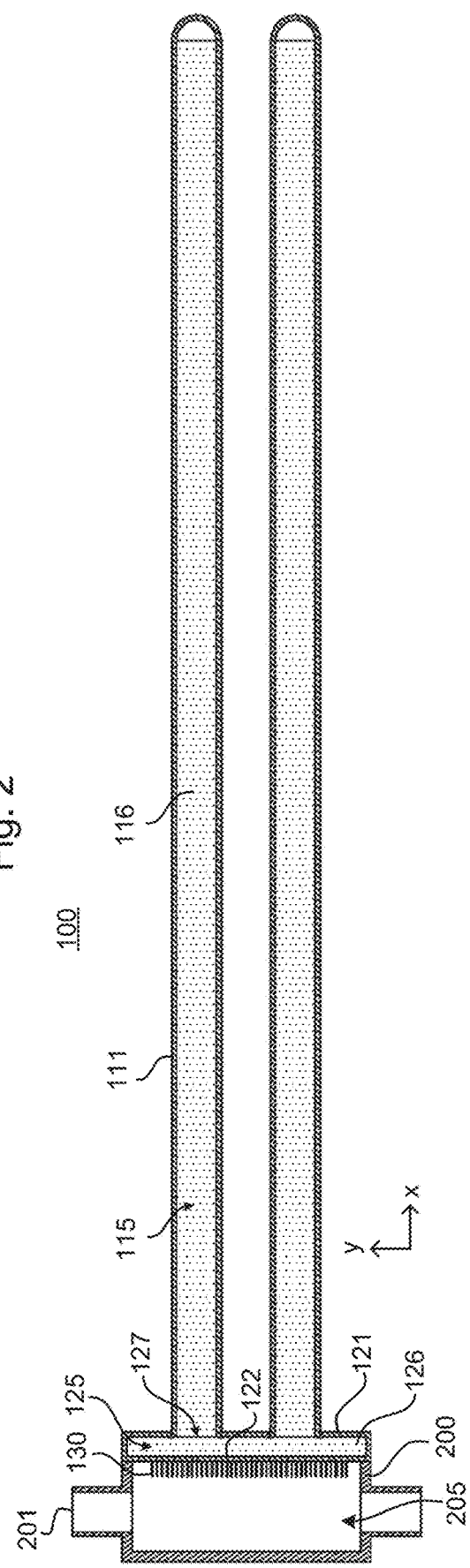
FIG. 2 illustrates a cross-sectional view of the first example memory module cooling device. The cross-section is taken along a plane parallel to the x-y plane in FIG. 3 along a center of the first example memory module cooling device.
Figure 3:
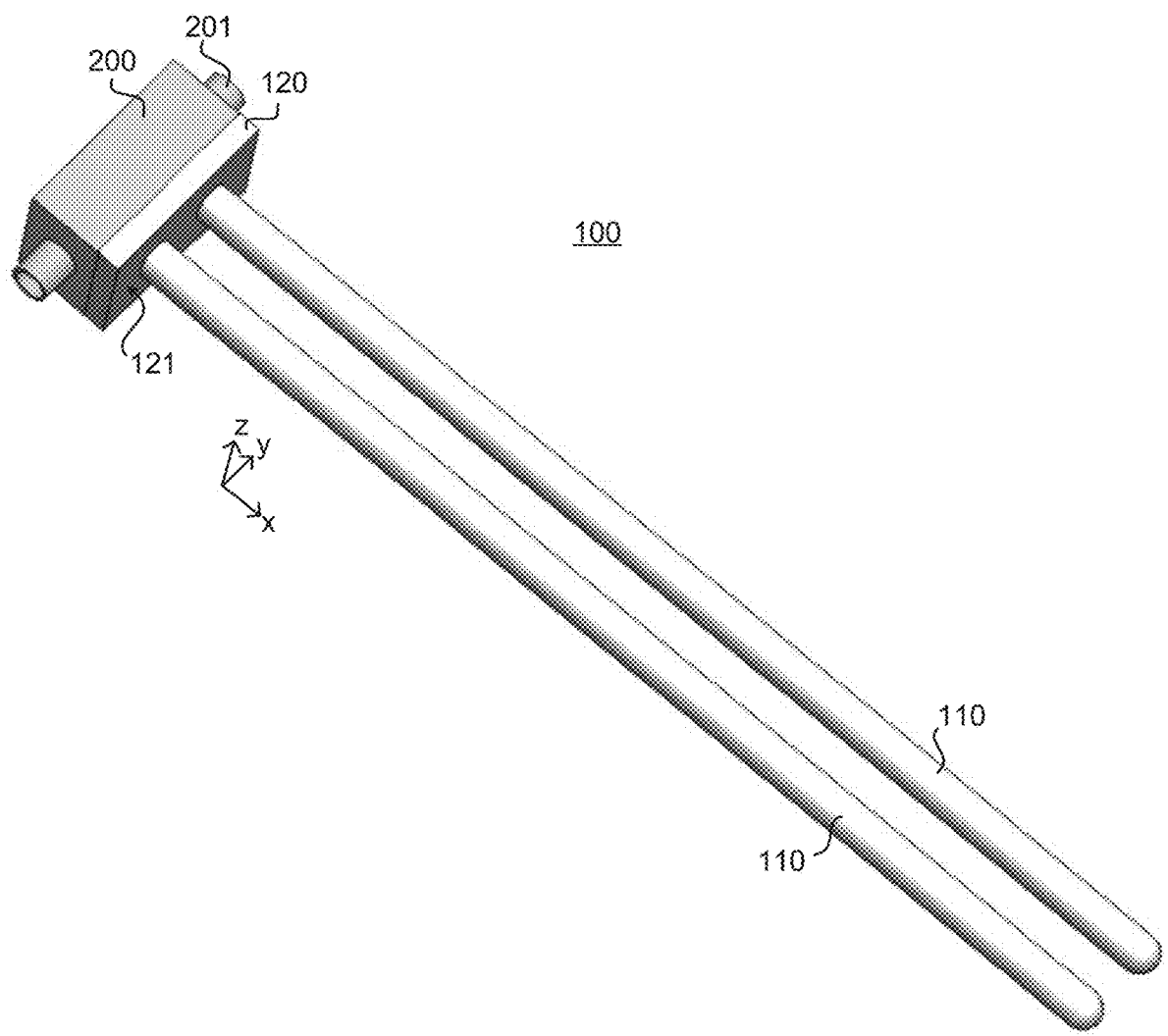
FIG. 3 illustrates another perspective view of the first example memory module cooling device.

An example memory module cooling device 100 (hereinafter "memory cooler 100") is described in detail below with reference to FIGS. 1-3. The example memory cooler 100 is one specific example of the memory coolers described herein. As illustrated in FIGS. 1-3, the memory cooler 100 may include a number of heat pipes 110, a vapor chamber device 120, and fins 130. The fins 130 and one of the walls of vapor chamber device 120 (i.e., the second wall 122) together may form a cold plate for transferring heat from the memory cooler 100 to a heat removal medium such as liquid coolant or air. In some examples (but not necessarily all), the memory cooler 100 may also include a cold plate cover 200.

In the art, a device for transferring heat to a heat removal medium is often referred to as a "cold plate" when the heat removal medium is a liquid, and is often referred to as a "heat sink" when the heat removal medium is air. However, for simplicity, all such devices for transferring heat to a heat removal medium are referred to herein as "cold plates" regardless of the type of heat removal medium.

The heat pipes 110 may be any type of heat pipe. For example, a heat pipe 110 may include a case or vessel comprising one or more walls 111 (see FIGS. 1-3) that enclose a volume, referred to herein as a vapor channel 115 (see FIG. 2). The walls 111 may be formed by any material (or combination of materials) having a melting point (or melting points) higher than 100° C. In general, the walls 111 (or at least a portion thereof) may be formed by a thermally conductive material, to facilitate conduction of heat from the memory modules into the heat pipe 110. For example, the walls may include a metal such as copper, aluminum, etc. In the Figures, the heat pipe 110 is shaped like a cylinder. However, the heat pipe 110 may have any shape that satisfies the definition for "heat pipe" noted below. For example, the heat pipe 110 may have an elliptical cross sectional shape. As another example, the heat pipe 110 may be a cylindrical segment (e.g., an approximately cylindrical shape but with two flat sides parallel to the longitudinal axis that are connected by curved sides). In some examples, the heat pipe 110 may be dimensioned such that it is capable of fitting between two adjacent memory modules installed in a computing device, with an elongated dimension of the heat pipe 110 extending in parallel to the memory modules.

The vapor channel 115 may have a wick 116 disposed therein (see FIG. 2). The wick 116 may be any structure that is configured to cause a liquid phase of a working fluid disposed in the vapor channel 115 to move through the heat pipe 110, for example via capillary action. For example, the wick 116 may be formed by a sintered powder coating on the interior surface of the wall(s) 111, by a screen or mesh inserted within the vapor channel 115, by grooves formed in or on the interior surface of the wall(s) 111, by porous materials inserted within the vapor channel 115, by fibers inserted within the vapor channel 115, etc. In FIG. 2, a sintered powder wick 116 is represented conceptually by dots; however, these dots are not intended to be to scale or indicate specific structural features of the wick 116. When there are more than one heat pipes 110, the wicks 116 of their respective vapor channels 115 can be, but do not necessarily have to be, formed from the same type of structure.

The vapor chamber device 120 may be any type of vapor chamber device. For example, the vapor chamber device 120 may include a case or vessel comprising walls (see FIGS. 1-3) that enclose a volume (see FIG. 2), referred to herein as a vapor chamber 125. The walls of the vapor chamber device 120 may be formed by any material (or combination of materials) having a melting point (or melting points) higher than 100° C. In general, the second wall 122 may be formed by a thermally conductive material, to facilitate conduction of heat from the working fluid into the second wall 112. For example, the second wall 112 may include a metal such as copper, aluminum, etc. In the Figures, the vapor chamber device 120 is shaped like a shallow (approximately planar) cuboid, with first and second walls 121, 122 corresponding to the two faces of the cuboid with the largest area and the remaining faces of the cuboid corresponding to side walls that connect the first wall 121 to the second wall 122. However, the vapor chamber device 120 may have any other shape that satisfies the definition of "vapor chamber device" noted below. For example, the vapor chamber device 120 may have one or more curved faces instead of all straight faces. As another example, the vapor chamber device 120 may not have any side walls between the first and second walls 121, 122—for example, the first and second walls 121, 122 may connect directly to one another (with some bending of one or both walls 121, 122 to accommodate the vapor chamber 125).

The vapor chamber 125 may have a wick 126 disposed therein (see FIG. 2). The wick 126 may be any structure that is configured to cause a liquid phase of a working fluid disposed in the vapor chamber 125 to move through the vapor chamber device 120, for example via capillary action. The wick 126 of the vapor chamber 125 may be, but does not necessarily have to be, formed by the same type of structure as any of the wicks 116 of the vapor channels 115. For example, the wick 126 may be formed by a sintered powder coating, a screen or mesh, groves, porous materials, fibers, etc. In FIG. 2, a sintered powder wick 126 is represented conceptually by dots; however, these dots are not intended to be to scale or to indicate specific structural features of the wick 126.

The heat pipes 110 may be connected to the vapor chamber device 120 such that their respective interior volumes (i.e., the vapor channels 115 and the vapor chamber 125) are communicably connected (see FIG. 2). In particular, a working fluid (not illustrated) may be disposed in the vapor chamber 125 and the vapor channels 116, and the connection between the heat pipes 110 and the vapor chamber device 120 may be such that the working fluid may communicate between the vapor chamber 125 and the vapor channels 115. For example, the heat pipes 110 may each have an opening at one end thereof, and the open end of each heat pipe 110 may be connected to a first wall 121 of the vapor chamber device 120 at a corresponding hole in the first wall 121 such that the opening in the heat pipe 110 and the corresponding hole in the first wall 121 define an opening 127 that allows the working fluid to communicate between the vapor channel 115 and the vapor chamber 125 (see FIG. 2). In some examples, the heat pipes 110 and the vapor chamber 120 are formed separately and are connected together subsequently. In such examples, the heat pipes 110 may be connected to the vapor chamber device 120 by any method, such as, for example, soldering, mechanical fasteners, cutting threads into the outer side of the heat pipes 110 and into the holes of the first wall 121 and screwing the heat pipes 110 into the holes, and so on.

The fins 130 may extend outward from a second wall 122 of the vapor chamber device 120 (see FIGS. 1 and 2). In particular, the fins 130 may be part of the same continuous body as the second wall 122. For example, a solid block of metal may be skived to produce the fins 130 and the second wall 122 as parts of a single continuous body. In examples in which the fins 130 are part of the same continuous body as the second wall 122, the fins 130 and the second wall 112 necessarily are formed from the same material. In examples in which the fins 130 are not part of the same continuous body as the second wall 122, the fins 130 may be formed from any thermally conductive material, such as copper, aluminum, etc. In some examples, the fins 130 may be shaped like planar sheets or strips with their largest-area faces being approximately perpendicular to the second wall 122 (see FIGS. 1 and 2). Although the fins 130 are illustrated in the Figures as running in the z-direction, the fins 130 may run in any direction. In general, any number of fins 130 greater than or equal to two may be included. Increasing the number of fins may increase the rate at which heat is transferred into the heat removal medium, all other things being equal. The fins 130 may have any thickness, height, or length. Increasing the heath and/or length of the fins 130 may increase the rate at which heat is transferred into the heat removal medium, all other things being equal. Decreasing the thickness of the fins 130 may allow more fins 130 to be included. The fins 130 may be separated by any distances, which may be the same distance between each fin 130 or different distances. Decreasing the distance between fins 130 may allow more fins 130 to be included; however, increasing the distance between fins 130 may improve flow of the heat removal medium through the fins 130.

When it is said herein that two features are "part of the same continuous body", this means that there is at least one point of union between the two features in which there is no break or separation (gap) between the materials constituting the features (apart from the usual inter-atom or inter-molecule spacing in the bulk material); in other words, there is no appreciable thermal interface between the two features. For example, two features that are part of the same continuous body may be formed by working a single solid body of material to shape the features in the body (e.g., by skiving, extrusion, milling, etc.), solidification of a single continuous volume of liquid material into a single solid body that has the two features (e.g., by casting, injection molding, etc.), or other similar processes (e.g., by powder metalworking). In contrast, two features would not be "part of the same continuous body" as the phrase is used herein if they are distinct bodies that are, for example, (a) merely in contact with one another, and/or (b) merely attached to one another (for example, by adhesives, mechanical fasteners, soldering, welding, etc.). Note that usage of the term "continuous" herein is not intended to imply anything about whether the material constituting the body is homogenous, heterogeneous, amorphous, crystalline, or polycrystalline.

In the examples illustrated in the Figures, the wall of the vapor chamber device 120 from which the fins 130 extend (i.e., the second wall 122) and the wall of the vapor chamber device 120 to which the heat pipes 110 are connected (i.e., the first wall 121) are the two largest-area walls of the vapor chamber device that are opposite from one another (see, e.g., FIG. 1-4). However, in some examples (not illustrated), some or all of the heat pipes 110 may be connected to a first wall 121 that is not one of the two largest-area walls and/or opposite from the second wall 122. For example, the first wall 121 may be a side wall that connects the two largest-area walls together. As another example, the heat pipes 110 are not necessarily all connected to the same wall as one another.

In some examples, the memory cooler 100 may include a cold plate cover 200 (see FIGS. 2-4). In some examples, the cold plate cover 200 may be for forming a liquid coolant chamber 120 such that liquid coolant of a liquid cooling system may flow over the fins 130. In other examples, the cold plate cover 200 may be for forming an air shroud for directing an airflow of an air cooling system over the fins 130.

More specifically, in examples in which the memory cooler 100 is to be installed in a liquid cooling system, the cold plate cover 200 may be sealed liquid tight to the vapor chamber device 120 (for example, at the second wall 122), such that the cold plate cover 200 and the second wall 120 may bound a volume, referred to hereinafter as a liquid coolant chamber 205. The liquid coolant chamber 205 may be for holding liquid coolant, which may act as a heat removal medium to remove heat from the fins 130. The liquid coolant chamber 205 may be liquid tight, except for openings in hose connectors 201 (if any). The cold plate cover 200 may be sealed to the vapor chamber device 120 by any sealing mechanism. In this context, "sealing" two objects together refers to physically fastening the objects together in a manner that forms a liquid-tight seal at their interface. In some examples, a single mechanism may provide both physical fastening and liquid-tight sealing (e.g., an adhesive that bonds two walls together), while in other examples multiple mechanisms may cooperate together to provide the physical fastening and the liquid-tight seal (e.g., mechanical fasteners for the physical fastening and a gasket for the liquid-tight seal).

In some examples the cold plate cover 200 includes hose connectors 201 to which hoses of a liquid coolant system may be connected. In such examples, the hose connectors 201 may be any type of hose connector. For example, the hose connectors 201 may be barb connectors, which include barbs to engage with a hose. As another example, the hose connectors 201 may be dry-disconnect couplings, which may allow the openings of the hose connectors 201 to be closed liquid tight when desired (such as when connecting or disconnecting a hose) and opened when desired (such as during normal operation). Liquid coolant may flow into and out of the liquid coolant chamber 205 through the openings in the tube connectors 201.

In examples in which the memory cooler 100 is to be installed in an air cooling system, the cold plate cover 200 may be omitted, or if included may be designed to guide an airflow over the fins 130. However, in such examples the cold plate cover 200 need not necessarily be sealed liquid tight to the vapor chamber device 120.

FIG. 4 illustrates an example computer 1000, which includes the example memory cooler 100 described above. The computer 1000 includes a main printed circuit board (PCB) 1001, the memory cooler 100, and a cooling system 1020. The main PCB 1001 may include a processor (not illustrated), memory sockets 1003, and memory modules 1004 installed in the memory sockets 1003. The main PCB 1001 may also include any additional components (not illustrated), such as I/O controllers, a memory controller, disk controllers, communications controllers, read-only-memory (ROM), expansion slots, etc. The computer 1000 may also include one or more removable or peripheral components (not illustrated) that may be connected to the main PCB 1001, such as storage devices, expansion cards, etc. The processor of the main PCB 1001 may include any circuitry that is capable of executing machine readable instructions, including a processor, a central processing unit (CPU), microprocessor, microcontroller, field-programmable gate array (FPGA), complex programmable logic device (CPLD), digital signal processor, graphics processor, coprocessor, etc.

The memory cooler 100 is installed such that the heat pipes 110 are thermally coupled to the memory modules 1004, with an elongated dimension of the heat pipes 110 extending in parallel with an elongated dimension of the memory modules 1004. For example, each memory module 1004 may be in contact with at least one heat pipe 110, either directly or via an intermediary such as a thermal interface material (e.g., thermal grease, thermal gap pad, etc.). In some examples, the heat pipes 110 may be interleaved with the memory modules 1004. In some examples, at least some of the memory modules 1004 are in contact with two heat pipes 110 each, either directly or via an intermediary such as a thermal interface material. In some examples, all of the memory modules 1004 are in contact with two heat pipes 110 each, either directly or via an intermediary such as a thermal interface material (see FIG. 4). The memory cooler 100 may be secured to the main PCB 1001 in the installed position by any means. For example, the memory cooler 100 may include a mechanical fastener 190, such as a screw and socket.

The cooling system 1020 may be any cooling system that is to cool one or more components of the computer 1000. For example, the cooling system 1020 may be a liquid cooling system that uses liquid coolant as a heat removal medium. As another example, the cooling system 1020 may be an air cooling system that uses air as a heat removal medium. The cooling system 1020 may cause the heat removal medium to flow over the fins 130 of the memory cooler 100, thereby removing heat from the fins 130 and cooling the memory modules 1004. In FIG. 4, an example is illustrated in which the cooling system 1020 is a liquid cooling system.

In examples in which the cooling system 1020 is a liquid cooling system, it may include a number of hoses (tubes) 1021, a pump 1022, and a heat exchanger 1023. The hoses 1021 may be to carry liquid coolant between components of the liquid cooling system 1020. The pump 1022 may be to create a pressure difference to cause liquid coolant to flow through the liquid cooling system 1020. The heat exchanger 1023 may be to remove heat from the liquid coolant. For example, the heat exchanger 1023 may include a lattice of tubes through which the liquid coolant flows and around which air flows, such that the liquid coolant may release its heat into the air. For example, a fan 1025 may be included with the heat exchanger 1023 to cause the air to flow through the heat exchanger 1023. The cooling system 1020 may also include connectors (not illustrated), manifolds (not illustrated), cold plates (not illustrated), reservoir(s) (not illustrated), and the like, which together may form a closed loop (which may have one or more branches) through which the liquid coolant is caused to flow. The heat exchanger 1023 may be housed within a same chassis as the computing device 1000, or may be external to the chassis of the computing device 1000. In some examples, the same cooling system 1020 into which the memory cooler 100 is connected may also cool another component of the computer 1000, such as the processor, while in other examples the cooling system 1020 may be provided solely for cooling the memory modules 1004. In the example computer 1000, the hose connectors 201 of the memory cooler 100 are connected to hoses 1021 of the liquid cooling system 1020, such that a branch of the coolant flow (illustrated conceptually in FIG. 4 by a dashed line) flows through the liquid coolant chamber 205 of the memory cooler 100.

Although a liquid cooling version of the cooling system 1020 is described above and illustrated in FIG. 4, it should be understood that in some implementations of the example computer 1000, an air cooling version of the cooling system 1020 (not illustrated) that uses air as a heat removal medium may be used. In such an example, the computer 1000 may include one or more fans (not illustrated) that may be configured to cause air to flow over the fins 130 of the memory cooler 100. In some such examples, the memory cooler 100 may omit the cold plate cover 200, while in other examples the memory cooler 100 may include a cold plate cover 200 configured to guide an airflow over the fins 130.

FIG. 5 illustrates an example method of manufacturing a memory cooler, such as the example memory cooler 100.

In block 801, a vapor chamber device 120 is provided, the vapor chamber device 120 including a case with walls that bound a vapor chamber 125. In some examples, providing the vapor chamber device 120 may include obtaining possession of an already completed vapor chamber device 120. In some examples, providing the vapor chamber device 120 may include forming the vapor chamber device 120. For example, the vapor chamber device 120 may be formed by providing an uncompleted case 140 that includes a part that will correspond to the second wall 122, forming a completed case 141 that encloses a volume (i.e., vapor chamber 125) from the uncompleted case 140, and forming a wick 126 in the vapor chamber 125.

As used herein, an uncompleted case 140 is one or more parts that do not yet fully enclose a volume that will correspond to the vapor chamber 125. The forming of the completed case 141 from the uncompleted case 140 is completed when the walls of the case fully enclose the vapor chamber 125 (excluding holes for connecting heat pipes 110). In examples in which providing the vapor chamber device 120 includes forming the vapor chamber device 120, the vapor chamber device 120 has been fully provided when the completed case 141 has been formed and the wick 126 has been included therein.

The wick 126 may be formed prior to or after the forming of the completed case 141 is fully completed. The holes in the first wall 121 for connecting the heat pipes 110 may be formed prior to or after the forming of the completed case 141 is fully completed. The connecting of the heat pipes 110 to the first wall 121 may be completed prior to or after the forming of the completed case 141 is fully completed.

In one example of forming the vapor chamber device 120 from an uncompleted case 140, the uncompleted case 140 comprises a first piece 101 that will include the first wall 121 in the completed case 141 and a second piece 102 that will include the second wall 122 in the completed case 141. In this example, the completed case 141 may be formed by joining the first and second pieces 101, 102 together. For example, the first and second pieces 101, 102 may be joined together by welding, soldering, adhesives, mechanical fasteners, etc. In some examples, the first piece 101 is configured in a shape that include side walls perpendicular to the first wall 121 (like a box without a lid) (see, for example, FIGS. 6A, 7A, and 9A), and the side walls of the first piece 101 are joined to the second piece 102.

In another example of forming the vapor chamber device 120 from an uncompleted case 140, the uncompleted case 140 comprises a single piece 103. In this example, the completed case 141 may be formed by working the single unfinished piece 103 into a desired shape. For example, the single piece 103 may be a metal pipe (see, for example, FIG. 8A), and it may be worked to form the vapor chamber device 120 by compressing the pipe along its curved sides to form two flattened sides opposite from one another that will correspond to the first and second walls 121, 122 in the completed case 141 (see, for example, FIG. 8B), and then sealing the open ends of the flattened pipe (not illustrated) to fully enclose the vapor chamber 125. The open ends of the flattened pipe may be sealed, for example, by crimping the ends, attaching side walls over the openings, filling the openings with solder, etc.

In block 802, a number of heat pipes 110 that include vapor channels 115 are provided. In some examples, providing the heat pipes 110 may include obtaining possession of already completed heat pipes 110. In some examples, providing the heat pipes 110 may include forming the heat pipes 110. For example, a heat pipe 110 may be formed by providing an unfinished pipe, adding a wick 116 to an interior volume of the pipe, and sealing open ends of the pipes (for example, by crimping the ends, patching over the ends, etc.). In some examples, the unfinished pipe may be compressed to slightly flatten sides thereof. In some examples, the dimensions of the provided heat pipes 110 may be such that they are able to fit between adjacent memory modules installed in adjacent memory sockets of a computer. In some examples, the dimensions of the provided heat pipes 110 may be such that they are able to thermally couple (directly or via a thermal interface material) with both of two adjacent memory modules installed in adjacent memory sockets of a computer when the heat pipe is disposed between the two memory modules.

In block 803, the heat pipes 110 are connected to a first wall 121 of the case of the vapor chamber device 120 such that the heat pipe 110's vapor channels 115 are communicably connected to the vapor chamber 125. Specifically, an end of a heat pipe 110 that has an opening into its vapor channel 115 may be sealed to the first wall 121 of the vapor chamber device 120, such that the opening in the heat pipe 110 at least partially overlaps with a corresponding hole in the first wall 121, providing an aperture 127 through which a working fluid may flow between the vapor chamber 125 and vapor channel 115.

In some examples, the heat pipes 110 that are provided in block 802 may each have the aforementioned opening at one end thereof that allows access into its vapor channel 115. However, in other examples, the provided heat pipes 110 may not include this opening, in which case the process may include forming the openings in the heat pipes 110 during or prior to block 803. The openings may be formed, for example, by cutting off a portion of the end of the heat pipe 110, drilling or cutting a hole into an end of the heat pipe 110, etc.

The sealing of the heat pipes 110 to the first wall 121 of the case in block 803 may be of such a nature as to cause a combined volume comprising the vapor channels 115 and the vapor chamber 125 to be liquid tight (excluding a hole for adding working fluid, if any, which may be sealed later). For example, the heat pipes 110 may be soldered or welded to the first wall 121 of the vapor chamber device 120. As another example, the open end of the heat pipes 110 and the holes in the first wall 121 may be threaded, and the heat pipes 110 may be screwed into the holes. As another example, the heat pipes 110 may be attached to the vapor chamber device 120 via mechanical fasteners such as rivets together with a sealant (such as a gasket, silicon caulking, etc.). As another example, the heat pipes 110 may be attached to the vapor chamber device 120 via adhesives.

In block 804, fins 130 are formed extending from the second wall 122 of the case such that the fins 130 and the second wall 122 are part of the same continuous body. The fins 130 extend from an outward facing side of the second wall 122, while an interior facing side of the second wall 122 bounds the vapor chamber 125. In some examples, the fins 130 may be shaped like planar sheets or strips with their largest-area faces being approximately perpendicular to the second wall 122.

Although block 804 is illustrated in FIG. 5 as being performed after blocks 801-803, this need not necessarily be the case. In particular, the fins 130 may be formed extending from the second wall 122 at any point in the manufacturing process. Specifically, in some examples block 804 is performed before a completed case 141 is provided (as part of providing a vapor chamber device 120 in block 801). In other examples, block 804 is performed after a completed case 141 has been provided (as part of providing a vapor chamber device 120 in block 801). In some examples, block 804 is performed after a completed vapor chamber device 120 is provided. In addition, in some examples block 804 is performed before heat pipes 110 are provided in block 802 and/or connected to the vapor chamber device 120 in block 803, while in other examples block 804 is performed after heat pipes 110 are provided in block 802 and/or connected to the vapor chamber device 120 in block 803.

Figure 6A:
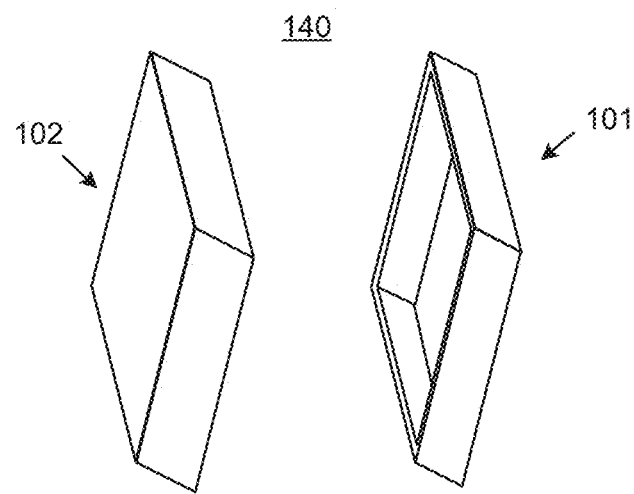
FIGS. 6A-C illustrate a first example process of forming a vapor chamber device and fins.
Figure 6B:
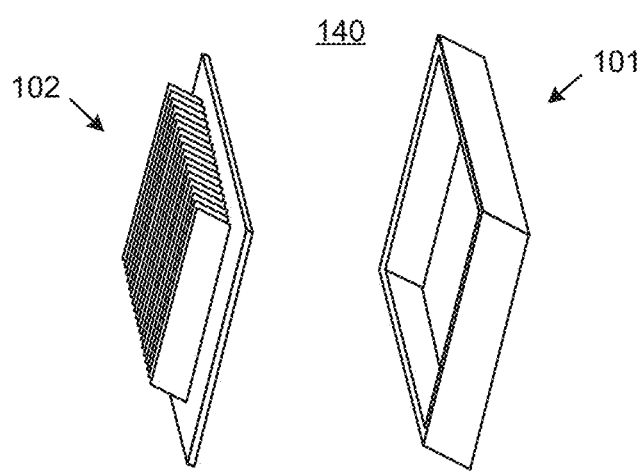
Figure 6C:
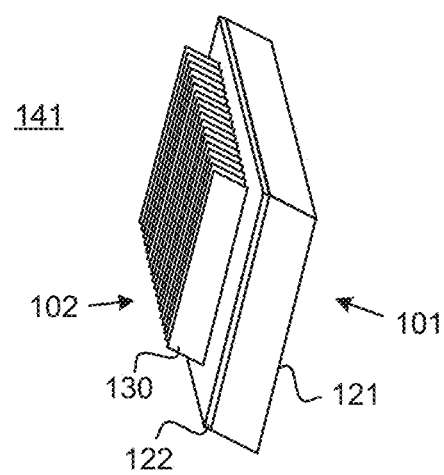

For example, FIGS. 6A-6C illustrate one example in which the fins 130 are formed before a completed case 141 is provided. In this example, a first piece 101 and a second piece 102 of an uncompleted case 140 are provided as separate pieces (see FIG. 6A). Next, the fins 130 are formed in the second piece 102 by skiving the second piece 102, removing material from the second piece 102 (e.g., by milling), or by extruding the second piece 102 (see FIG. 6B). Next, the completed case 141 is completed by sealing the second piece 102 to the first piece 101 (see FIG. 6C). One reason that it might be desired in certain circumstances to form the fins 130 according to this example is that the skiving or material removal process that is used to form the fins 130 in the second piece 102 may be easier to perform if the second piece 102 is just a solid block that is not yet connected to any other pieces.

Figure 7A:
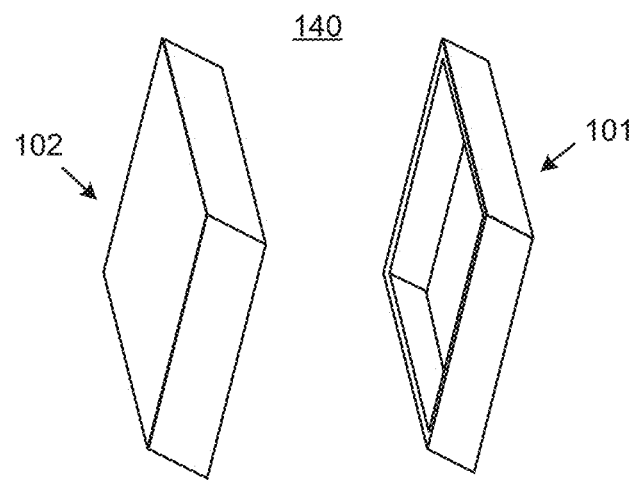
FIGS. 7A-C illustrate a second example process of forming a vapor chamber device and fins.
Figure 7B:
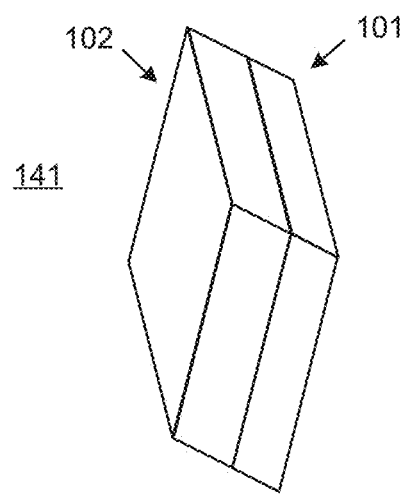
Figure 7C:
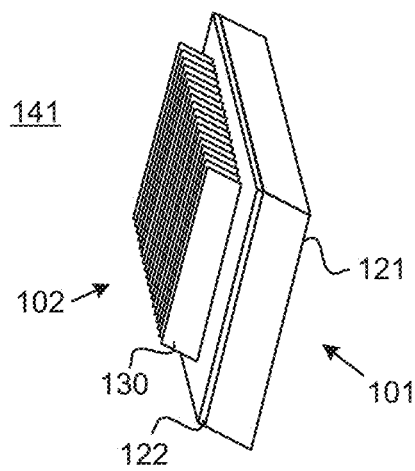

As another example, FIGS. 7A-7C illustrate one example in which the fins 130 are formed after completed case 141 has been provided. In this example, a first piece 101 and a second piece 102 of an uncompleted case 140 may be provided as separate pieces (see FIG. 7A) just as in the previous example. However, unlike the previous example, the first and second pieces 101, 102 may be sealed together, completing the formation of the completed case 141, before the fins 130 are formed (see FIG. 7B). Alternatively, a completed case 141 may be obtained rather than being formed (e.g., by purchase from a third party). Next, the fins 130 are formed in the completed case 141 by skiving or removing material from the portion the completed case 151 that corresponds to the second piece 102 (see FIG. 7C).

As another example (not illustrated), a fully formed vapor chamber device 120 (regardless of how it was formed) may have one of its walls skived or subjected to a material removal process (e.g., milling) to form fins 130 therein.

Figure 8A:
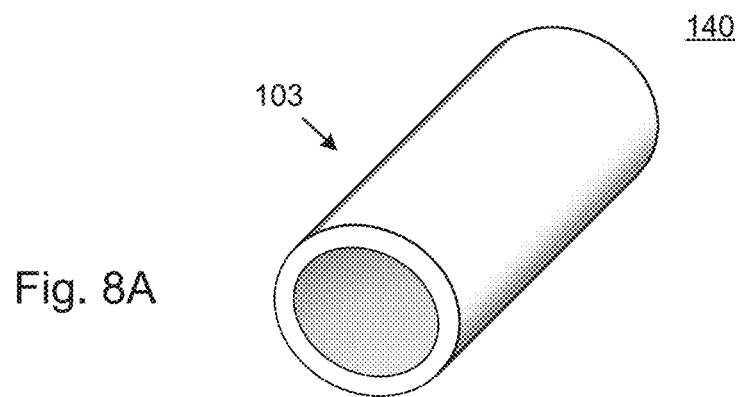
FIGS. 8A-C illustrate a third example process of forming a vapor chamber device and fins.
Figure 8B:
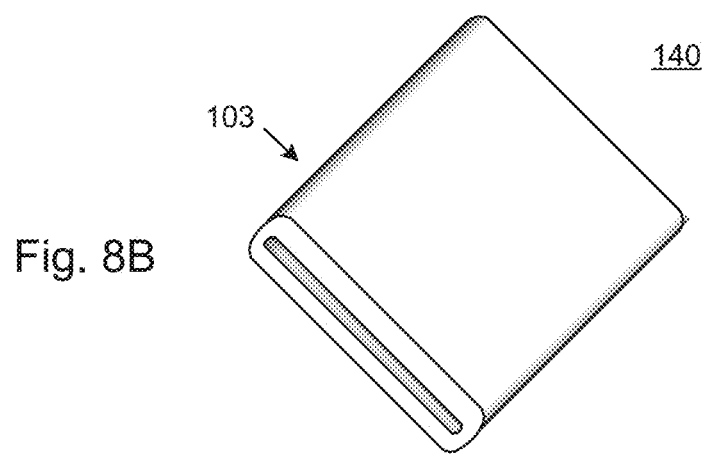
Figure 8C:
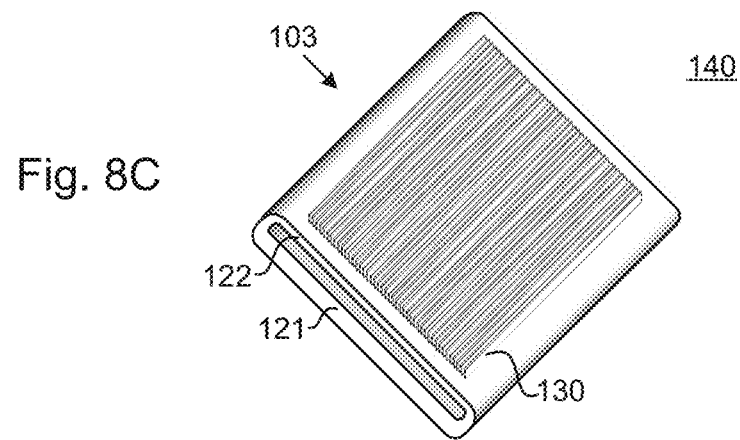

As another example, FIGS. 8A-8C illustrate one example in which the completed case 141 is formed from an uncompleted case 140 comprising a single piece 103. In the illustrated example, the single piece 103 is a pipe (see FIG. 8A), which is compressed to form two flat walls on opposite sides of one another (see FIG. 8B). In this example, the fins 130 may be formed extending from one of the flat walls by skiving or a material removal process (e.g., milling) (see FIG. 8C). In the example illustrated in FIG. 8C, the fins 130 are formed prior to completed case 141 being formed, but the fins 130 could also be formed after the completed case 141 is formed. (In this example, the completed case 141 is formed by closing the two openings at the ends of the squished pipe, e.g., via crimping, attaching a wall over the openings, etc.).

Figure 9A:
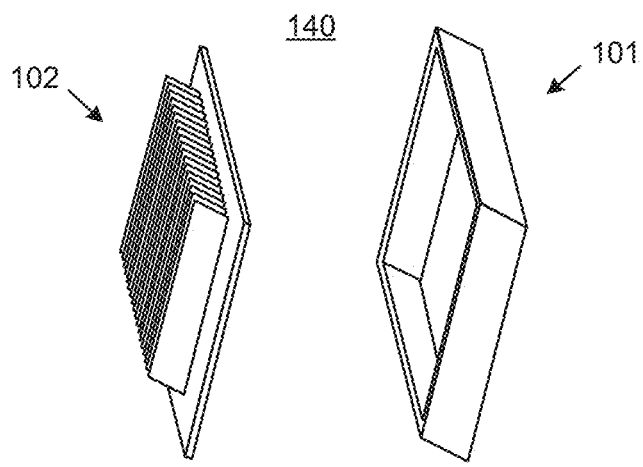
FIGS. 9A-B illustrate a fourth example process of forming a vapor chamber device and fins.
Figure 9B:
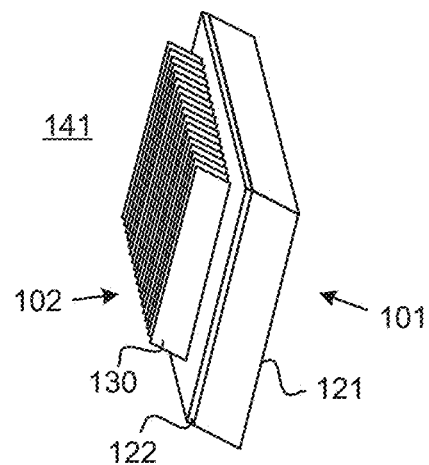

As another example, FIGS. 9A-9B illustrate one example in which the completed case 141 is formed from an uncompleted case 140 in which the fins 130 and the second wall 122 are integrally formed together. In particular, the uncompleted case 140 comprises a first piece 101 and a second piece 102 (see FIG. 9A), just as in the first two examples. However, unlike in the first two examples, the fins 130 and second wall 122 are integrally formed together in the second piece 102, rather than being formed by working (e.g., skiving, milling, extruding, etc.) a solid block of metal. For example, the first piece 101 may be formed by a solidification process (e.g., casting, injection molding, etc.) or a powder metalworking process into the desired shape. Next, the first and second pieces 101, 102 are sealed together (see FIG. 9B), completing the formation of the vapor chamber device.

In FIGS. 6A, 7A, and 9A, the first piece 101 is illustrated as being shaped as a solid cuboid and the second piece is illustrated as being shaped as an open box. However, the first and second pieces 101 and 102 may have any other shapes. For example, the side walls illustrated as being part of the first piece 101 could instead be included on the second piece 102. As another example, the side walls illustrated as being part of the first piece 101 could be provided as additional pieces that are separate from the first and second pieces 101, 102. As another example, no side walls might be provided, and instead the first piece 101 may be curved such that a vapor chamber is formed when the first and second pieces 102 are sealed together.

Although not illustrated in FIG. 5, a working fluid is also disposed within the vapor chamber and/or the vapor channels as part of manufacturing the memory cooler. The working fluid may be added to the vapor chamber and/or vapor channels prior to connecting the heat pipes to the first wall (i.e., prior to block 803), or after connecting the heat pipes to the first wall (i.e., after block 803). If the working fluid is added to the vapor chamber and/or the vapor channels after connecting the heat pipes to the first wall, one or more of the vapor chamber device and heat pipes may have an opening through which the working fluid is added, which may be closed after the fluid has been added to seal the interior volume liquid tight.

The operations described above could be performed in different orders than that described above and illustrated in FIG. 5. In addition, multiple operations may be performed concurrently or as part of the same single action or group of actions. That is, the fact that two (or more) operations are described separately herein (or recited as part of different elements in the appended claims) does not necessarily imply that the operations must be performed by distinct actions.

Heat pipe: As used herein, "heat pipe" refers to a case (vessel) having walls that bound (i.e., form/define the boundary of; enclose) a vapor channel, with one dimension of the case being three or more times larger than both of the two other dimensions of the case. The walls of the case either fully enclose the vapor channel (i.e., there is no liquid-passable opening from an exterior of the case into the vapor channel), or enclose the vapor channel with the exception of an opening at an end of the case that is communicably connected into a vapor chamber of a vapor chamber device (or will be so connected when the heat pipe is assembled into a memory module cooling device).

Vapor channel: As used herein, "vapor channel" refers to the enclosed volume within a heat pipe in which a working fluid and a wick are disposed.

Vapor chamber device: As used herein, "vapor chamber device" refers to a case (vessel) having walls that bound (i.e., form/define the boundary of; enclose) a vapor chamber, with two dimensions of the case each being three or more times larger than a third dimension of the case. The walls of the case either fully enclose the vapor chamber (i.e., there is no liquid-passable opening from an exterior of the case into the vapor chamber), or enclose the vapor chamber with the exception of one or more openings in a wall of the case that are communicably connected into respectively corresponding vapor channels of heat pipes (or will be so connected when the vapor chamber device is assembled into a memory module cooling device).

Vapor chamber. As used herein, "vapor chamber" refers to the enclosed volume within a vapor chamber device in which a working fluid and a wick are disposed.

Cold plate and heat sink: As used herein, "cold plate" means a device for dissipating heat into a heat removal medium that comprises a base and fins extending from the base. As used herein, the "base" of a cold plate is a piece of metal having a face that extends perpendicularly to the fins to which the fins are directly connected.

Liquid-tight: As used herein, "liquid-tight" means impervious to a liquid coolant at least at a temperature of 20° and a pressure of 2 atm.

Thermally couple: As used herein, to "thermally couple" two objects means to provide a conductive pathway between the objects that allows heat to be conducted between the objects. This includes placing the two objects in direct contact with one another, as well as placing the objects in direct contact with one or more thermally conductive intermediaries (such as thermal interface material and/or a heat transfer element), which are successively in contact with one another.

Computer. As used herein, a "computer" is any electronic device that includes a processor and that is capable of executing programs comprising machine-readable instructions, including, for example, a server, a converged (or hyperconverged) appliance, a rack-scale system, some storage arrays, a personal computer, a laptop computer, a smartphone, a tablet, etc.

Thermally conductive: As used herein, an object comprising a continuous body of the same material is considered "thermally conductive" if the material forming the object is "thermally conductive". As used herein, a material is "thermally conductive" if it has thermal conductivity (often denoted k, λ, or κ) of 1 W·m$^{-1}$·K$^{-1}$ or greater at any temperature between 0° C. and 100° C. Examples of materials that are thermally conductive include almost all metals and their alloys (e.g., copper, aluminum, gold, etc.), some plastics (e.g., TECACOMP® TC compounds, CoolPoly® D-series Thermally Conductive Plastics), and many other materials. As used herein, a material is "highly thermally conductive" if it has thermal conductivity of 100 W·m$^{-1}$·K$^{-1}$ or greater at any temperature between 0° C. and 100° C. Examples of materials that are highly thermally conductive include copper, silver, gold, aluminum, and many other metals and their alloys. As used herein, an object comprising multiple distinct bodies (possibly of different materials) is considered "thermally conductive" if the object as a whole has a heat transfer coefficient of 10 W·m$^{-2}$·K$^{-1}$ or greater from one end of the object to the other end of the object at any temperature between 0° C. and 100° C., and is considered "highly thermally conductive" if the object as a whole has a heat transfer coefficient of 1000 W·m$^{-2}$·K$^{-1}$ or greater from one end of the object to the other end of the object at any temperature between 0° C. and 100° C. An example of a highly thermally conductive object that comprises multiple distinct bodies is a heat pipe.

Provide: As used herein, to "provide" an item means to have possession of and/or control over the item. This may include, for example, forming (or assembling) some or all of the item from its constituent materials and/or, obtaining possession of and/or control over an already-formed item.

A number. Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of active optical devices, wherein the active optical devices . . . " could encompass both one active optical device and multiple active optical devices, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

And/or. Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently (i.e., in parallel).

While the above disclosure has been shown and described with reference to the foregoing examples, it should be understood that other forms, details, and implementations may be made without departing from the spirit and scope of this disclosure.

What is claimed is:

1. A method of manufacturing a memory module cooler, comprising:
    providing a vapor chamber device that bounds a vapor chamber;
    providing a number of heat pipes that include vapor channels;
    connecting the heat pipes to a first wall of the vapor chamber device such that the respective vapor channels of the heat pipes are communicably connected to the vapor chamber via openings in the first wall; and
    forming fins that extend from a second wall of the vapor chamber device, the second wall bounding the vapor chamber, the fins and the second wall being part of the same continuous body.

2. The method of claim 1, further comprising:
    introducing a working fluid into the vapor chamber and/or the vapor channels; and
    sealing liquid tight a combined chamber that comprises the vapor chamber and the vapor channels.

3. The method of claim 1, further comprising:
    forming a liquid coolant chamber by sealing a cold plate cover to the second wall, the fins located within the liquid coolant chamber.

4. The method of claim 1,
    wherein the fins are formed after a completed case of the vapor chamber device is provided.

5. The method of claim 4,
    wherein forming the fins includes skiving the second wall of the vapor chamber device.

6. The method of claim 1,
    wherein providing the vapor chamber device includes:
        providing an uncompleted case that includes a portion corresponding to the second wall; and
        forming a completed case from the uncompleted case; and
    the fins are formed before completing the forming of the completed case from the uncompleted case.

7. The method of claim 6,
    wherein the uncompleted case includes at least two distinct parts, one of which includes the portion corresponding to the second wall; and
    the forming of the completed case from the uncompleted case includes attaching the at least two distinct parts together.

8. The method of claim 6,
    wherein forming the fins includes skiving the portion of the uncompleted case that corresponds to the second wall.

* * * * *